(12) United States Patent
Totsuka

(10) Patent No.: US 9,013,765 B2
(45) Date of Patent: Apr. 21, 2015

(54) SOLID-STATE IMAGING APPARATUS

(75) Inventor: Hirofumi Totsuka, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 710 days.

(21) Appl. No.: 12/882,458

(22) Filed: Sep. 15, 2010

(65) Prior Publication Data

US 2011/0080625 A1 Apr. 7, 2011

(30) Foreign Application Priority Data

Oct. 7, 2009 (JP) ................................ 2009-233707

(51) Int. Cl.
*H04N 1/04* (2006.01)
*H04N 9/04* (2006.01)
*H04N 5/359* (2011.01)
*H01L 27/146* (2006.01)

(52) U.S. Cl.
CPC .......... *H04N 9/045* (2013.01); *H01L 27/14609* (2013.01); *H04N 5/3595* (2013.01)

(58) Field of Classification Search
None
See application file for complete search history.

(56) References Cited

U.S. PATENT DOCUMENTS

| | | | |
|---|---|---|---|
| 5,801,373 A | 9/1998 | Oozu et al. | 250/208.1 |
| 7,633,540 B2 | 12/2009 | Totsuka | 348/294 |
| 7,742,092 B2 * | 6/2010 | Koseki et al. | 348/300 |
| 8,059,319 B2 | 11/2011 | Totsuka | |
| 8,072,519 B2 | 12/2011 | Noda et al. | |
| 8,189,081 B2 | 5/2012 | Totsuka | 348/294 |
| 2002/0034011 A1 * | 3/2002 | Nakai | 359/569 |
| 2006/0001753 A1 * | 1/2006 | Funakoshi et al. | 348/308 |
| 2006/0169871 A1 | 8/2006 | Kochi | 250/208.1 |
| 2007/0216915 A1 | 9/2007 | Tsukahara | 358/1.9 |
| 2008/0049130 A1 | 2/2008 | Koizumi et al. | 348/298 |
| 2009/0115876 A1 | 5/2009 | Totsuka | 348/294 |
| 2009/0141157 A1 | 6/2009 | Kobayashi et al. | 348/308 |

(Continued)

FOREIGN PATENT DOCUMENTS

| | | |
|---|---|---|
| CN | 101365040 A | 2/2009 |
| CN | 101483712 A | 7/2009 |

(Continued)

OTHER PUBLICATIONS

Notification of the First Office Action dated Aug. 31, 2012, in Chinese Application No. 201010296464.3.

(Continued)

*Primary Examiner* — Vincent Rudolph
*Assistant Examiner* — John Wallace
(74) *Attorney, Agent, or Firm* — Fitzpatrick, Cella, Harper & Scinto

(57) ABSTRACT

A solid-state imaging apparatus comprises a plurality of unit cell groups including a plurality of unit cells each including a plurality of light shielded optical black pixels, non-light shielded effective pixels and amplifying circuits for amplifying signals from the pixels; and holding capacitors each receiving a signal from corresponding unit cell, so that signals are transferred from all the pixels by a vertical transfer operation and a horizontal transfer operation, each of which is repeated by the number of times equal to the number of the unit cell groups, such that the signals from an optical black pixel and an effective pixel are respectively transferred by the vertical transfer operation and the signals transferred by the vertical transfer operation are successively read out by the horizontal transfer operation to reduce the degrading image quality due to artifact by properly removing an offset varying for each output if it occurs.

9 Claims, 12 Drawing Sheets

(56) References Cited

U.S. PATENT DOCUMENTS

| | | |
|---|---|---|
| 2009/0322922 A1 | 12/2009 | Saito et al. ............... 348/308 |
| 2010/0006743 A1 | 1/2010 | Kato et al. ............... 250/208.1 |
| 2010/0079648 A1 | 4/2010 | Totsuka et al. ............... 348/308 |
| 2010/0214461 A1 | 8/2010 | Totsuka ............... 348/300 |
| 2010/0214463 A1 | 8/2010 | Kato et al. ............... 348/302 |
| 2011/0007173 A1 | 1/2011 | Takenaka et al. |

FOREIGN PATENT DOCUMENTS

| | | |
|---|---|---|
| JP | 6152856 A | 5/1994 |
| JP | 06-204445 A | 7/1994 |
| JP | 2006-211363 A | 8/2006 |
| JP | 2007-251836 A | 9/2007 |
| JP | 2008-054246 A | 3/2008 |
| JP | 2008-060949 A | 3/2008 |
| JP | 2009-117904 A | 5/2009 |
| JP | 2009-188732 A | 8/2009 |
| WO | 2009/060877 A1 | 5/2009 |

OTHER PUBLICATIONS

Office Action issued by the Japanese Patent Office on Aug. 27, 2013, in counterpart Japanese Appl'n. No. 2009-233707 (with partial English language translation).

* cited by examiner

SOLID-STATE IMAGING APPARATUS

BACKGROUND OF THE INVENTION

1. Field of the Invention

The present invention relates to solid-state imaging apparatus.

2. Description of the Related Art

As a solid-state imaging apparatus for an image scanning apparatus like a copying machine and a scanner, there is a solid-state imaging apparatus that includes photodiodes for reading out different color components and holding capacitors corresponding to respective photodiodes as shown in FIG. 1 of Japanese Patent Application Laid-Open No. 2006-211363 (Patent Document 1).

Japanese Patent Application Laid-Open No. 2006-211363 discloses the solid-state imaging apparatus that has one common output line, whereas Japanese Patent Application Laid-Open No. H06-204445 (Patent Document 2) proposes the solid-state imaging apparatus that can output a signal for each of the color components as shown in FIG. 4. Since the arrangement disclosed in Japanese Patent Application Laid-Open No. H06-204445 outputs signals through a plurality of common output lines in parallel, it can reduce the time for reading out signals as short as that took by the arrangement disclosed in Japanese Patent Application Laid-Open No. 2006-211363 divided by the number of the common output lines.

When performance improvement such as improvement in an S/N ratio is required, an arrangement having an amplifying circuit provided for a vertical transferring unit, which operates at a low-speed, for amplifying signals in a narrow band to achieve low noise is utilized, as shown in Japanese Patent Application Laid-Open No. 2008-54246 (Patent document 3) and Japanese Patent Application Laid-Open No. 2008-60949 (Patent Document 4).

It is known, however, that an artifact according to the light intensity of the input image called smear may occur due to the above-mentioned amplifying circuit in the arrangements disclosed in Japanese Patent Application Laid-Open No. 2008-54246 and Japanese Patent Application Laid-Open No. 2008-60949. Other than the mechanism of causing the artifact shown in the above-mentioned documents, an artifact may be caused by such a mechanism in which an excess current that is generated when a signal from the previous stage is sampled in the holding capacitor changes a source bias with its source impedance, and the change in the source offsets the signal value from each column. Also, when a source follower circuit is used as the amplifying circuit in a pixel, the bias on the current source transistor of the source follower circuit is pressed by the signals, resulting in the current change, which may offset the signal value from each column. Here, the 'smear' may appear white (floating component) or black (sinking component) to the light intensity according to the place it is generated and the polarity of the signal.

The present invention has been adapted in view of the above circumstances and has an object of enabling the reduction of degrading image quality due to artifacts such as smear.

SUMMARY OF THE INVENTION

The present invention provides a solid-state imaging apparatus comprising: a plurality of unit cell groups each including a plurality of unit cells each including a plurality of pixels having spectral sensitivities different from each other; and a plurality of holding capacitors to which signals are transferred from the unit cells, wherein the solid-state imaging apparatus performs a vertical transfer operation for transferring the signal from the unit cell to the holding capacitor, and a horizontal transfer operation for reading successively the signal in the holding capacitor, such that the signals from an optical black pixel and an effective pixel included in each of the unit cell group are respectively transferred to the holding capacitor by the vertical transfer operation, and the signals transferred by the vertical transfer operation are successively read out by the horizontal transfer operation.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First, the configuration and drive of the solid-state imaging apparatus and a mechanism of degrading the image quality caused by smear in the solid-state imaging apparatus will be described.

Figure 1:
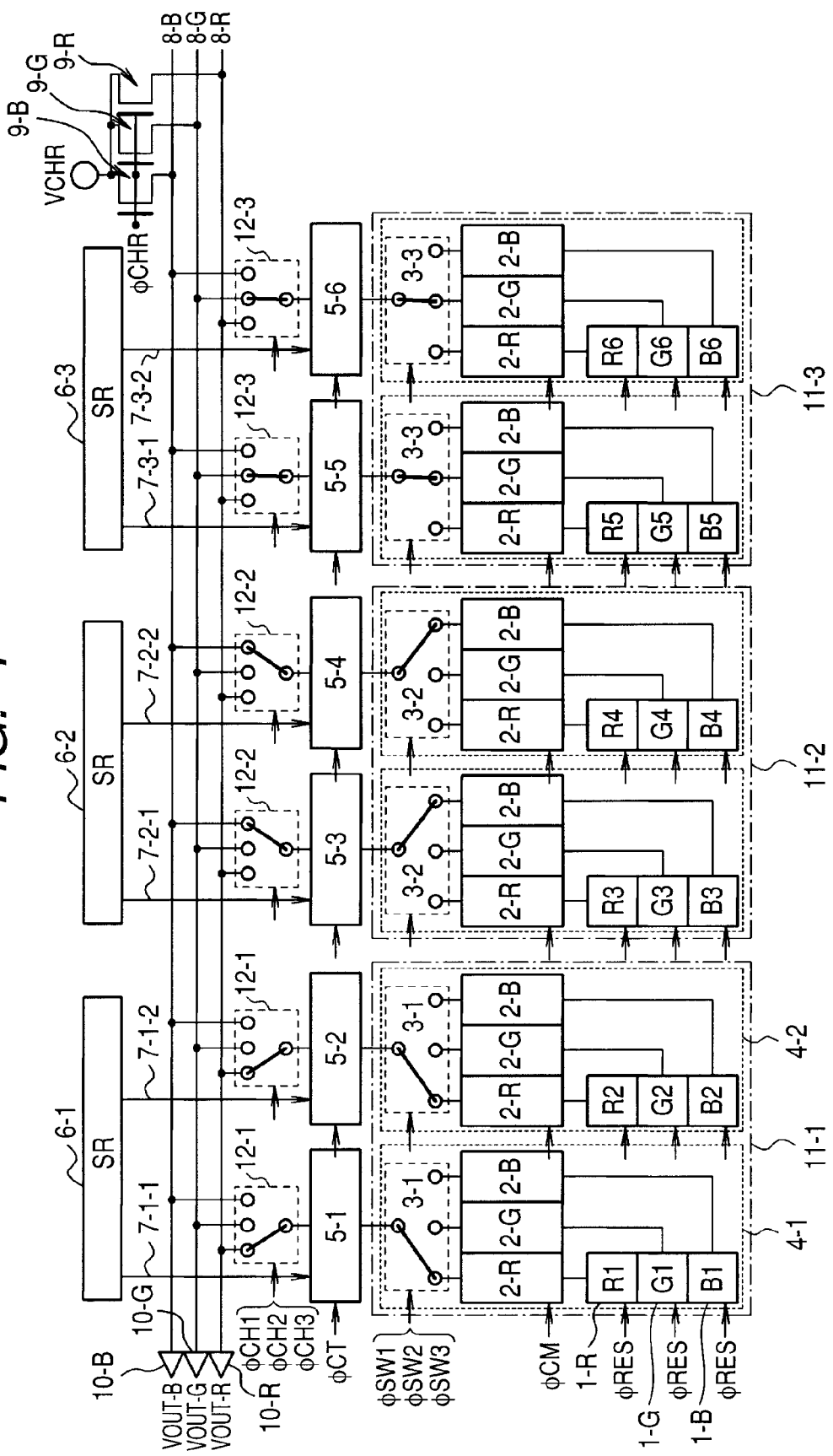
FIG. 1 is a diagram illustrating an example of configuration of part of a solid-state imaging apparatus according to an embodiment of the present invention.

FIG. 1 is a diagram illustrating an example of configuration of part of a solid-state imaging apparatus according to an embodiment of the present invention. FIG. shows color sensors for detecting three colors as an example.

FIG. 1 shows a pixel 1, an intermediate holding unit 2 for holding a signal from the pixel 1, a selecting unit 3 for selecting and outputting an output signal from the intermediate holding unit coupled thereto, and a unit cell 4 including the pixels 1 and the intermediate holding units 2 as many as the pixels, and a selecting unit 3. In each unit cell 4, the pixels 1 having different spectral sensitivities from each other are arranged in columns, for example, to read out different color components respectively. In the example, it is assumed that each of R, G and B components is read out from each of the pixels 1, and each component is called R pixel 1-R, G pixel 1-G and B pixel 1-B. In each unit cell 4, one pixel may be allocated to each color. Here, the intermediate holding units coupled to the R pixel 1-R, the G pixel 1-G and the B pixel 1-B are called 2-R, 2-G and 2-B, respectively.

The figure also shows a holding unit 5 for holding an output signal from the unit cell 4, a scanning circuit 6 for successively scanning the signals from the holding units 5, and a scanning line 7 output from the scanning circuit 6 for scanning of the holding units 5. The figure also shows a common output line 8 for outputting a signal from each of the holding units 5 according to a scan signal of the scanning line 7, a resetting unit 9 for resetting the common output line 8 to the voltage VCHR according to the gate signal φCHR, and an output circuit 10 for amplifying and outputting the signal from the common output line 8. The figure also shows a unit cell group 11 which is a group of a plurality of unit cells 4, arranged in a row, for example. For example, the unit cell groups 11 may also be arranged in a row. The figure also shows a switch unit 12 for connecting the holding unit 5 and the common output line 8 according to control signals φCH1, φCH2 and φCH3.

Here, in the embodiment, the scanning circuit 6 can be three of 6-1 to 3 corresponding to the unit cell groups 11-1 to 3. The scanning circuits 6-1 to 3 can scan the holding units 5 corresponding to the unit cell groups 11-1 to 3 by the scan signals 7 at a time. Each of the common output lines 8 can output color components (R, G, B), each of which is called 8-R, 8-G and 8-B. The resetting units 9-R, 9-G and 9-B and output circuits 10-R, 10-G and 10-B are provided corresponding to the common output lines 8-R, 8-G and 8-B, respectively. In FIG. 1, it is assumed that the alphanumerics R-1 to R-6, G-1 to G-6 and B-1 to B-6 in the pixels 1 represent color column numbers of the pixel. Hereinafter, it is assumed that a switch or a transistor that functions as a switch is driven to the conducting state by the high-level control signal (gate signal) and is returned to the non-conducting state by the low-level control signal.

Now, components of the solid-state imaging apparatus shown in FIG. 1 will be described below.

(Pixel 1)

Figure 2:
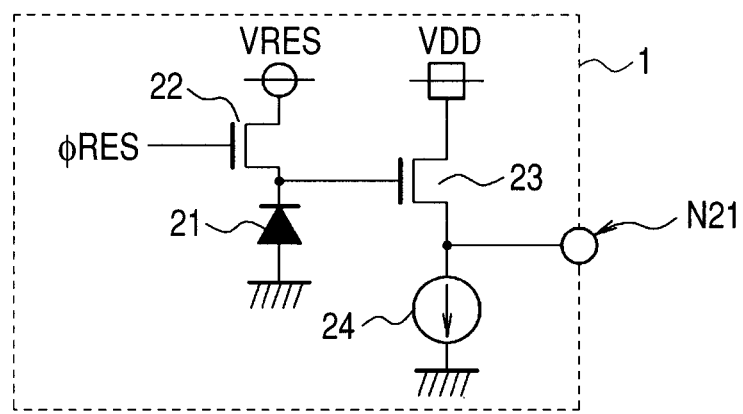
FIG. 2 is a diagram illustrating an example of configuration of a pixel according to the embodiment.

FIG. 2 is a diagram illustrating an example of configuration of the pixel 1. FIG. 2 shows a photoelectric conversion element 21 (for example, a photodiode) and a reset transistor 22 for resetting the photoelectric conversion element 21 to the voltage VRES according to the gate signal φRES. Also shown is an input transistor 23 of the source follower circuit for receiving a signal from the photoelectric conversion element 21 and a constant current circuit 24 of the source follower circuit. The constant current circuit may be provided for each pixel or a plurality of pixels. The constant current circuit 24 may be a MOS transistor, in which a predetermined voltage is supplied to a gate, a drain is connected to a source of the input transistor 23, and the source is connected to a power supply. The output signal that is subjected to the photoelectric conversion in the pixel 1 is output from a node N 21.

(Intermediate Holding Unit 2)

Figure 3:
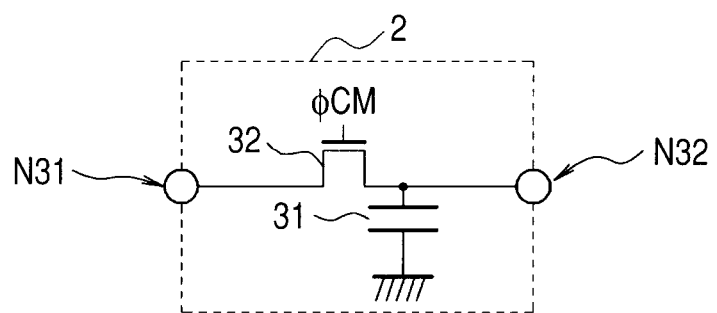
FIG. 3 is a diagram illustrating an example of configuration of an intermediate holding unit according to the embodiment.

FIG. 3 is a diagram illustrating an example of configuration of the intermediate holding unit 2. FIG. 3 shows an intermediate holding capacitor 31, and a first writing switch 32 for writing according to the gate signal φCM. The intermediate holding unit 2 has the node N31 connected to the node N21 of the corresponding pixel 1 and the node N32 connected to the selecting unit 3. In the intermediate holding unit 2, the first writing switch 32 is driven to the conducting state by the high-level gate signal φCM so that the signal from the corresponding pixel 1 is written into the intermediate holding capacitor 31.

(Selecting Unit 3)

Figure 4:
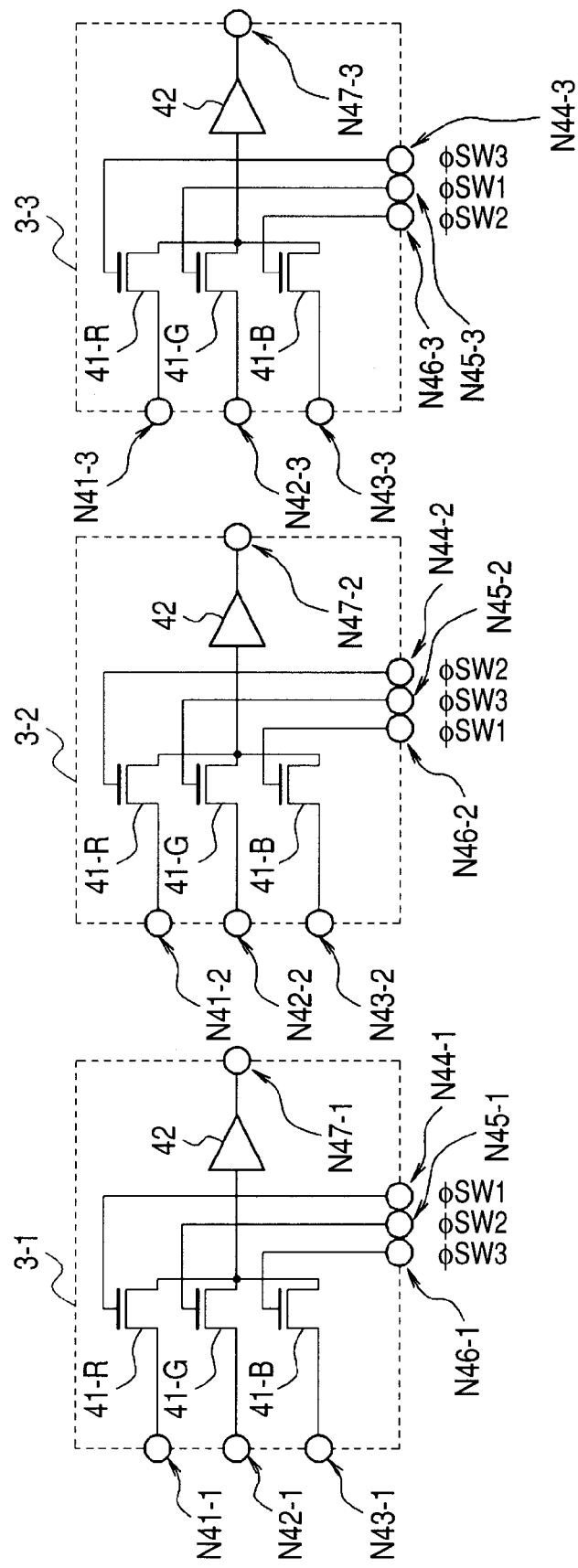
FIG. 4 is a diagram illustrating an example of configuration of a selecting unit according to the embodiment.

FIG. 4 is a diagram illustrating an example of configuration of a selecting unit 3-1 in a first unit cell group 11-1, a selecting unit 3-2 in a second unit cell group 11-2, and a selecting unit 3-3 in a third unit cell group 11-3. FIG. 4 shows a selection transistor 41 and an amplifying circuit 42. In the embodiment, since the selecting units 3 output the signals held in the intermediate holding units 2 (intermediate holding capacitor 31) for three pixels R, G, and B, the selection transistor 41 includes three of selection transistors 41-R, 41-G and 41-B. The amplifying circuit 42 may be the source follower circuit or the amplifying circuits described in Patent Documents 3 and 4. The drains of the selection transistors 41 are connected to respective intermediate holding units 2 (nodes N32 of intermediate holding units 2) via corresponding nodes N41, and the respective sources are coupled to the input node of the amplifying circuits 42. That is, the signal from the unit cell 4 is output from a node N47 via the amplifying circuit 42. Different control signals φSW1, φSW2 and φSW3 are applied to the gates of the respective selection transistors 41, and according to the control signals, a signal is selected from the corresponding intermediate holding unit 2 and output via the amplifying circuit 42. In FIG. 4, the amplifying circuit 42 is arranged after the selection transistor 41, i.e., one amplifying circuit 42 is arranged for each column, but the amplifying circuit 42 may be arranged before the selection transistor 41. Control signals φSW1, φSW2 and φSW3 are coupled to the selecting units 3-1, 3-2 and 3-3 respectively as shown in the figure, and the control signals φSW are applied to the selection transistors 41 via nodes N44, N45 and N46, respectively. Accordingly, the selecting units 3 can select one from the intermediate holding units 2 of different color components in each of the unit cell groups 11.

(Holding Unit 5)

Figure 5:
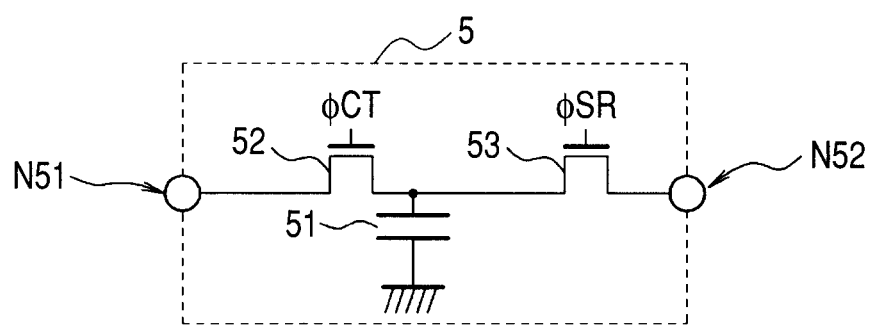
FIG. 5 is a diagram illustrating an example of configuration of a holding unit according to the embodiment.

FIG. 5 is a diagram illustrating an example of configuration of the holding unit 5. FIG. 5 shows a holding capacitor 51, a second writing switch 52 for writing according to a gate signal φCT, and a transferring switch 53 for transferring a signal from the holding capacitor 51 to the common output line 8 according to the scan signal 7 (φSR) from the scanning circuit 6. The holding unit 5 has a node N51 coupled to a node N47 of the corresponding selecting unit 3 and has a node N52 coupled to the switch unit 12. In the holding unit 5, the second writing switch 52 is driven to the conducting state by the high level of the gate signal φCT so that the signal is written from the corresponding selecting unit 3 into the holding capacitor 51.

(Switch Unit 12)

Figure 6:
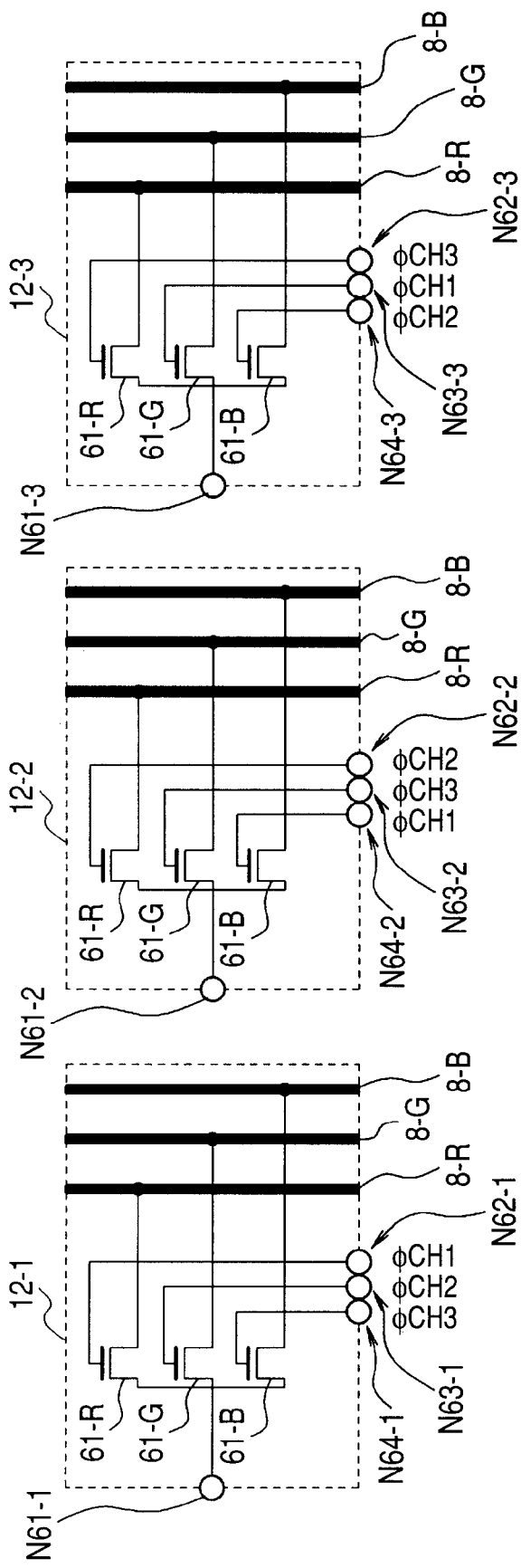
FIG. 6 is a diagram illustrating an example of configuration of a switch unit according to the embodiment.

FIG. 6 is a diagram illustrating an example of configuration of the switch unit 12. In FIG. 6, a switch unit 12-1 is the switch unit 12 corresponding to the unit cell group 11-1, a switch unit 12-2 is the switch unit 12 corresponding to the unit cell group 11-2, and a switch unit 12-3 is the switch unit 12 corresponding to the unit cell group 11-3. FIG. 6 shows a switching transistor 61 for connecting each holding units 5 to the common output lines 8 so as to output the signal input via a node N61 into the common output line 8. The switch units 12-1, 12-2 and 12-3 are coupled to control signals φCH1, φCH2 and φCH3 respectively as shown in the figure, and the control signals φCH are applied to the switching transistors 61 via nodes N62, N63 and N64, respectively. Accordingly, the switch unit 12 can select one of the common output lines 8 of different color components for the corresponding unit cell group 11, which is coupled thereto via the holding unit 5.

Figure 7:
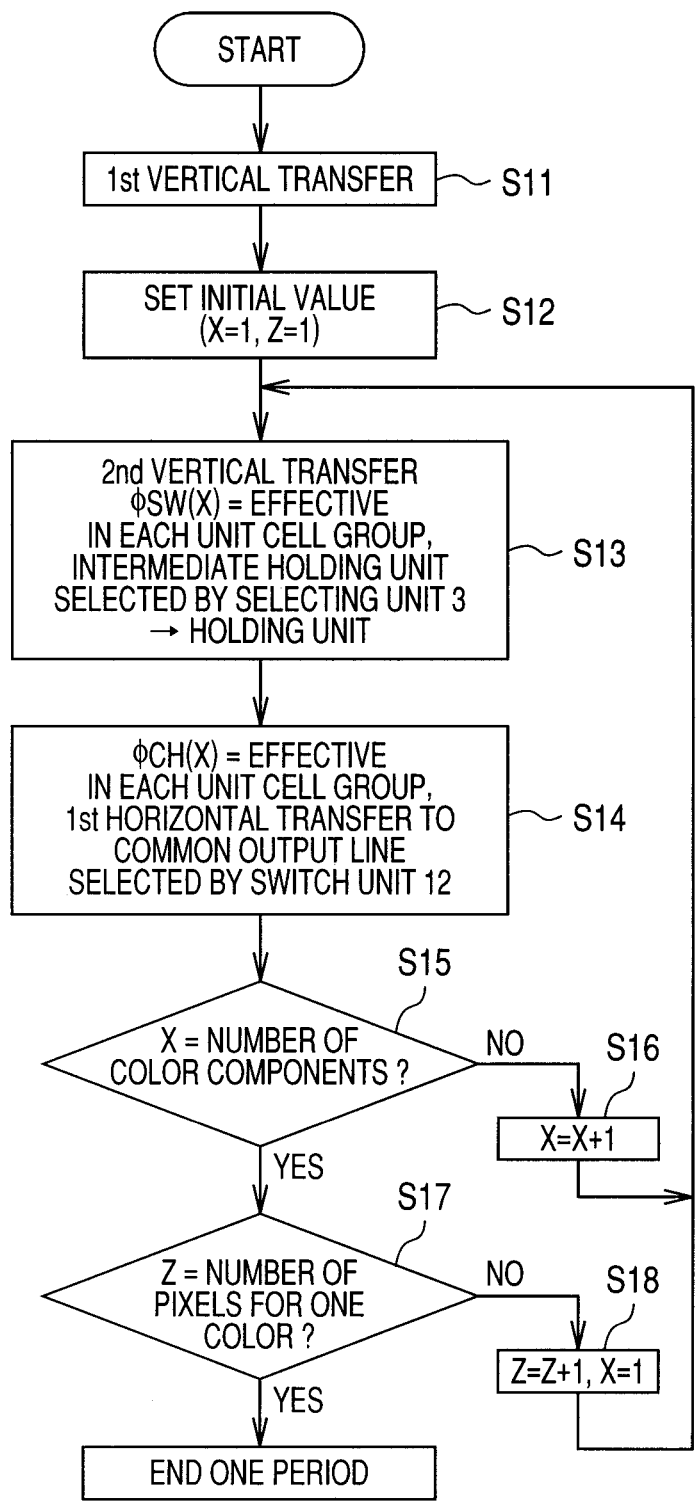
FIG. 7 is a flow chart illustrating an example of operation of the solid-state imaging apparatus shown in FIG. 1.
Figure 8:
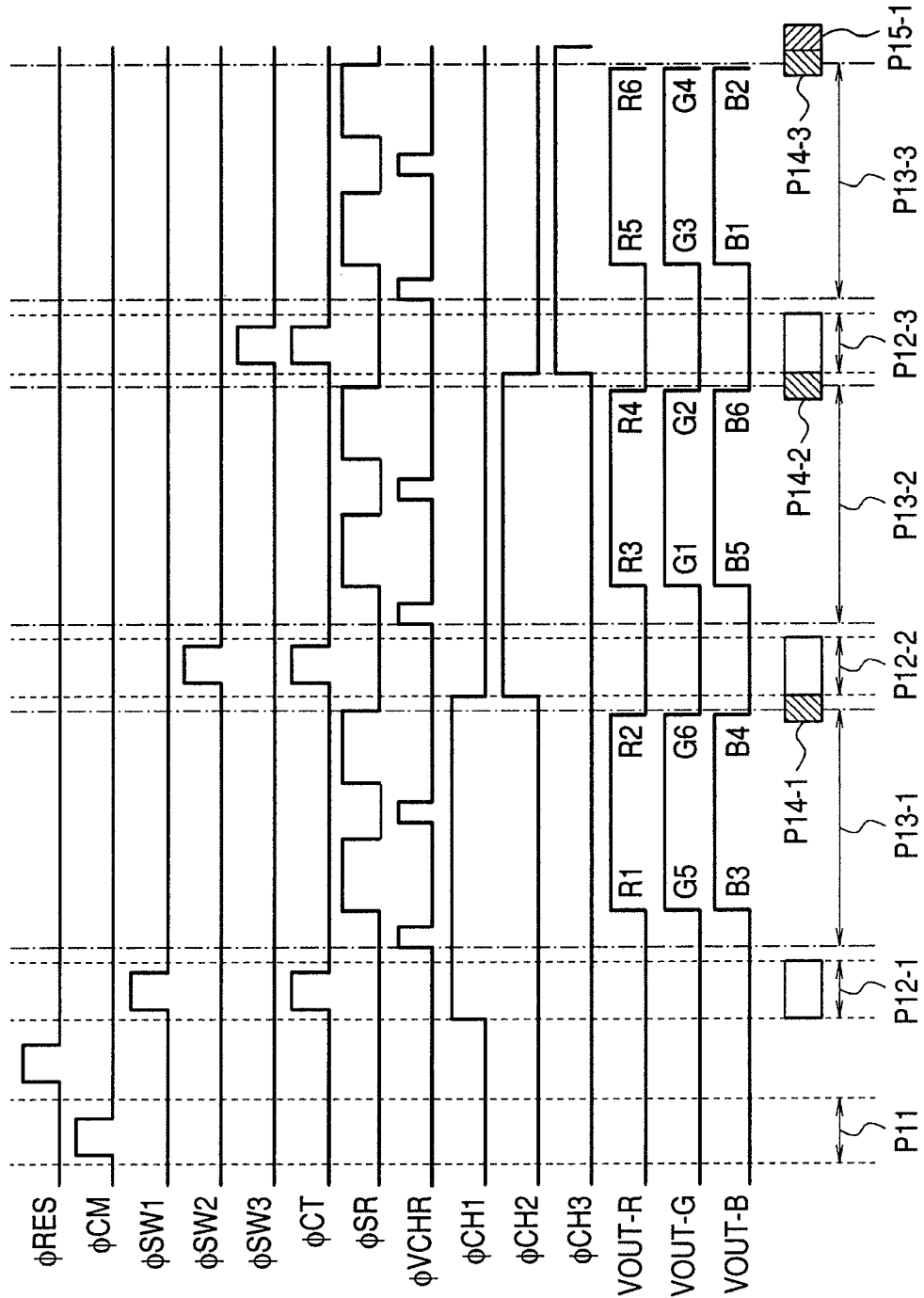
FIG. 8 is a timing chart illustrating an example of operation of the solid-state imaging apparatus shown in FIG. 1.

Now, the operation will be described with reference to FIGS. 7 and 8. FIG. 7 is a flow chart illustrating an example of operation of the solid-state imaging apparatus shown in FIG. 1, and FIG. 8 is a timing chart illustrating an example of operation of the solid state imaging apparatus shown in FIG. 1.

First, the operation starts with a period of accumulating the incident light in the photoelectric conversion element 21 in the pixel 1 (not shown). During the accumulation period, the electrical signal converted in the photoelectric conversion element 21 is amplified at the source of the input transistor 23 in the source follower circuit and output from there.

Next, in step S11, a first vertical transfer operation for transferring a plurality of signals from the pixels 1 to the intermediate holding units 2 almost at the same time is performed. In the first vertical transfer operation, signals from the pixels 1 are written into the corresponding intermediate holding capacitors 31 of the intermediate holding units 2 while the gate signal φCM is at the high level, and the signal values are held when the gate signal φCM falls (P11).

Next, in step S12, initial values of a first counter and a second counter are set. In the embodiment, both of the count value X of the first counter and the count value Z of the second counter are set to 1 (X=Z=1).

Then, in step S13, a second vertical transfer operation for transferring the signal held in the intermediate holding capacitor 31 of the intermediate holding unit 2 selected in the selecting unit 3 to the holding unit 5 is performed. In the second vertical transfer operation, the control signal φSW(X) is raised to the high level so that the signal is written from the intermediate holding unit 2 selected by the selecting unit 3 into the holding capacitor 51 of the holding unit 5 in each unit cell group 11.

Next, in step S14, a horizontal transfer operation for transferring the signals held in the holding capacitors 51 of the holding units 5 for respective unit cell groups 11 to optional common output lines 8 according to the scanning by the scanning circuits 6 and the switching by the switch units 12 in parallel is performed. In the horizontal transfer operation, the control signal φCH(X) is raised to the high level so that each of the holding units 5 is connected to the common output line 8 via the switch unit 12 and the signals from holding unit 5 is successively output according to the scanning of the scanning circuit 6. Accordingly, the signals transferred to the holding units 5 by the vertical transfer operation are successively read out and output.

Next, in step S15, a first discriminating operation is performed based on the count value X of the first counter. By the first discriminating operation, whether the count value X of the first counter is the same as the number of the color components (in the embodiment, three) or not is discriminated. The first counter counts the number of times the second vertical transfer operation (S13) is performed, for example. When the count value X is the same as the number of the color components (YES) according to the first discriminating operation, the operation proceeds to step S17; and if otherwise (NO), the count value X is incremented by 1 in step S16 and the operation returns to step S13.

In step S17, a second discriminating operation is performed based on the count value Z of the second counter. By the second discriminating operation, whether the count value Z of the second counter is the same number of the pixel for one color component in the unit cell 4 (in the embodiment, one) or not is discriminated. The second counter counts the number of times it is discriminated YES in the first discriminating operation (S15), for example. If the count value Z is not the same number of the pixel for one color component in the unit cell 4 (NO) according to the second discriminating operation, the count value Z is incremented by 1 and the count value X is set to 1 in step S18, and the operation returns to step S13. When the count value Z is the same as the number of the pixel for one color component in the unit cell 4 (YES) according to the second discriminating operation, the process for one cycle ends.

The operation after step S13 in the flow chart shown in FIG. 7 will be described in detail with reference to FIG. 8.

During the first time of the second vertical transfer operation (P12-1) performed after the operation in step S12, the control signal φSW1 is raised to the high level. Accordingly, in each unit cell group 11, the selecting unit 3 selects the intermediate holding unit 2 and the signal held in the intermediate holding capacitor 31 of the intermediate holding unit 2 is written into the holding capacitor 51 of the holding unit 5. Here, when the control signal φSW1 is raised to the high level, the selecting units 3-1 of the unit cell group 11-1 select the intermediate holding unit 2-R, the R component. Also, the selecting units 3-2 of the unit cell group 11-2 select the intermediate holding unit 2-B, the B component; and the selecting units 3-3 of the unit cell group 11-3 select the intermediate holding unit 2-G, the G component.

When the control signal φCH1 is raised to the high level, the holding units 5 coupled to each of the unit cell groups 11 are connected to respective common output lines 8 via the switch units 12. Here, when the control signal φCH1 is raised to the high level, the holding units 5 coupled to the unit cell group 11-1 are connected to the common output line 8-R, the R component. Also, the holding units 5 coupled to the unit cell group 11-2 are connected to the common output line 8-B, the B component; and the holding units 5 coupled to the unit cell group 11-3 are connected to the common output line 8-G, the G component. This switching operation needs to be completed at least before the following horizontal transfer operation starts.

When the first time of the second vertical transfer operation (P12-1) ends, the signals held in the holding units 5 are successively read out according to the scanning by the signal φSR from each of the scanning circuits 6 and output to respective common output lines 8 as the first time of the horizontal transfer operation (P13-1).

Next, the first time of the first discriminating operation (P14-1) is performed. Here, since the count value X of the first counter is 1, it is discriminated NO, then the count value X is counted up (X=X+1=2), and the second time of the second vertical transfer operation (P12-2) is performed. In the second time of the second vertical transfer operation (P12-2), the control signal φSW2 is raised to the high level. Accordingly, the selecting units 3-1 of the unit cell group 11-1 select the intermediate holding unit 2-G, the G component; the selecting units 3-2 of the unit cell group 11-2 select the intermediate holding unit 2-R, the R component; and the selecting units 3-3 of the unit cell group 11-3 select the intermediate holding unit 2-B, the B component. Then, the signals held in the intermediate holding capacitors 31 of the selected intermediate holding units 2 are written in the holding capacitors 51 of the holding units 5.

When the control signal φCH2 is raised to the high level, the holding units 5 coupled to the unit cell group 11-1 are connected to common output lines 8-G, the G component, via the switch units 12. Also, the holding units 5 coupled to the unit cell group 11-2 are connected to the common output line 8-R, the R component, via the switch units 12; and the holding units 5 coupled to the unit cell group 11-3 are connected to the common output line 8-B, the B component, via the switch units 12. Then, the second time of the horizontal transfer operation (P13 - 2) is performed so that the signals held in the holding units 5 are successively read out and output to the respective common output lines 8.

Next, the second time of the first discriminating operation (P14-2) is performed. Here, since the count value X of the first counter is 2, it is discriminated NO, then the count value X is counted up (X=X+1=3). Then, similar to the above-mentioned operation, the third time of the second vertical transfer operation (P12-3) and the third time of the horizontal transfer operation (P13-3) are performed. In the third time of the second vertical transfer operation and the third time of the horizontal transfer operation, the control signals φSW3 and φCH3 are appropriately raised to the high level, respectively.

Next, the third time of the first discriminating operation (P14-3) is performed. Here, since the count value X of the first counter is 3, it is discriminated 'YES,' and then the second discriminating operation (P15-1) is performed. Here, since the count value Z of the second counter is 1, it is discriminated 'YES,' and one cycle from the accumulation to the reading out finishes. Here, the signals from all the pixels have been read out. In the above-mentioned operations, the signals from the pixels 1 are read out in the orders shown in the FIG. 8 by the signals VOUT-R, VOUT-G and VOUT-B. In the case where only one color component is output from one common output line as mentioned above, signals of different colors from different regions are read out in parallel simultaneously time for all the common output lines.

Figure 9:
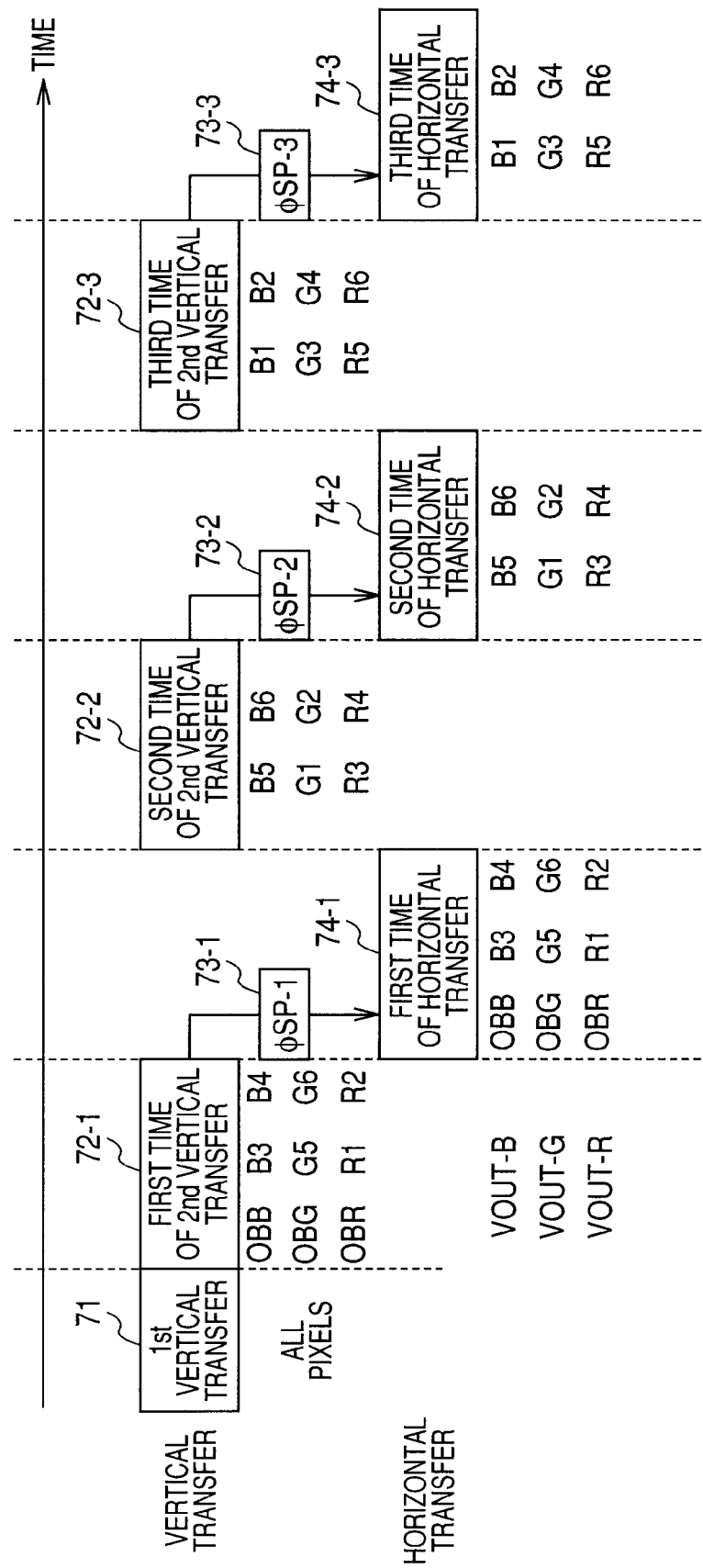
FIG. 9 is a timing flow chart illustrating an example of operation of a typical solid-state imaging apparatus.

Here, in general, when the signals from the solid-state imaging apparatus are received afterwards, outputs from light-shielded pixels (hereinafter, also referred to as optical black pixel) are clamped during each horizontal scanning period, and the black reference value for the row is set according to the clamped signal level. This clamp operation (hereinafter, also referred to as OB clamp) enables removal of the offset component. When the analog OB clamp is to be performed, signals from the optical black pixel need to be output at the beginning of one horizontal scanning period as shown in the timing flow in FIG. 9 to determine the black reference value for the following non-light shielded (also referred to as unshielded) pixels (also referred to as effective pixels). FIG. 9 shows the first vertical transfer operation 71, the second vertical transfer operations 72-1, 72-2 and 72-3, and the horizontal transfer operations 74-1, 74-2 and 74-3. The alphanumerics (R1, R2 and the like) under the boxes showing the transfer operations indicate the pixels, to which the signals are transferred by the transfer operations. In the case where the signals are output from the optical black pixel at the beginning of one horizontal transfer operation in the above-mentioned configuration, the signals are transferred by the first time of the second vertical transfer operation 72-1 and the signals are output from the respective common output lines 8 by the first time of the horizontal transfer operation 74-1. The boxes 73-1, 73-2 and 73-3 indicate start pulses φSP for starting the scan by the scanning circuits 6-1, 6-2 and 6-3. After the second vertical transfer operations 72-1, 72-2 and 72-3 are performed, the start pulses φSP are output to the scanning circuits 6, and in response, the scan starts and the horizontal transfer operations 74-1, 74-2 and 74-3 are performed.

Figure 10:
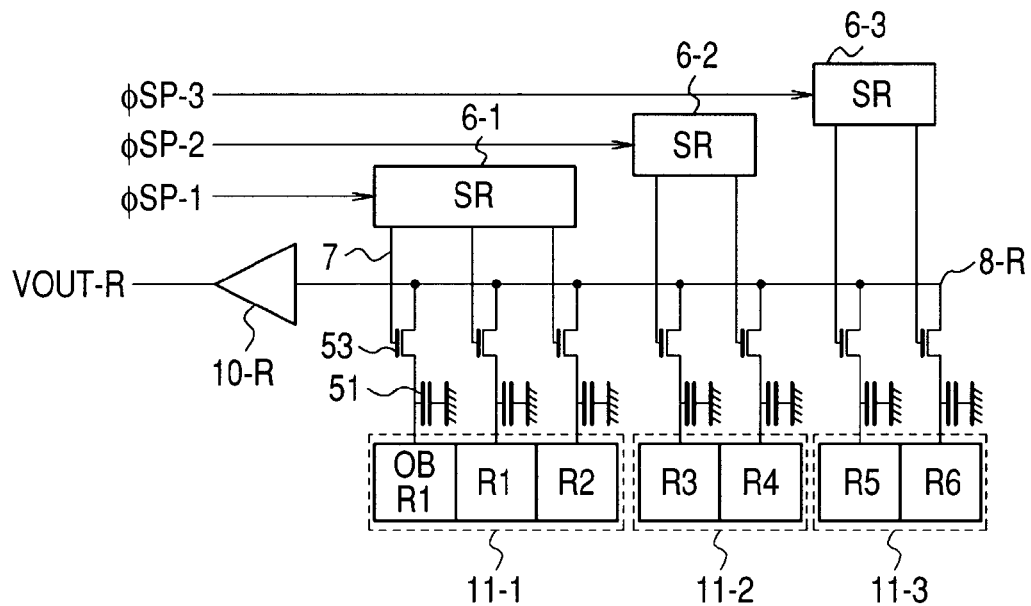
FIG. 10 is a schematic diagram illustrating a configuration for achieving the drive shown in FIG. 9.

FIG. 10 is a schematic diagram illustrating a configuration for achieving the drive. For simplicity, only the R pixel is shown in FIG. 10. In FIG. 10, the components having the same functions as those shown in FIGS. 1 and 5 are denoted by the same reference alphanumerics and redundant description thereof are omitted. As it is apparent from FIGS. 1 and 9, when all the R, G and B pixels are taken into consideration, the start pulses φSP are input into the scanning circuits 6-1, 6-2 and 6-3 three times for each of the pixels. When only the R pixel is taken into consideration, the start pulses φSP are input into the scanning circuits 6-1, 6-2 and 6-3 once as shown in FIG. 10. Since the optical black pixel of the R component (OBR1 in the figure) is contained in the unit cell group 11-1, the signals from the optical black pixel is read out in the horizontal transfer operation by the scan signal 7 from the scanning circuit 6-1. The G pixel and the B pixel also have the optical black pixels, respectively.

Next, the influences of the image degrading due to the smear in driving the above-mentioned solid-state imaging apparatus that contains the optical black pixel will be described. Here, it is assumed that the arrangement of the effective pixels in the six pixels is such that black signals are input in the first and second pixels, dark green signals are input in the third and fourth pixels, and light green signals are input in the fifth and sixth pixels. It is also assumed that neither the R component nor the B component is there, and the signals VOUT-R and VOUT-B output black. It is also assumed that the smear occurring here results in the 'floating' offset to the light intensity and that the smear occurs when the amplifying circuit 42 outputs the light signal.

Figure 11A:
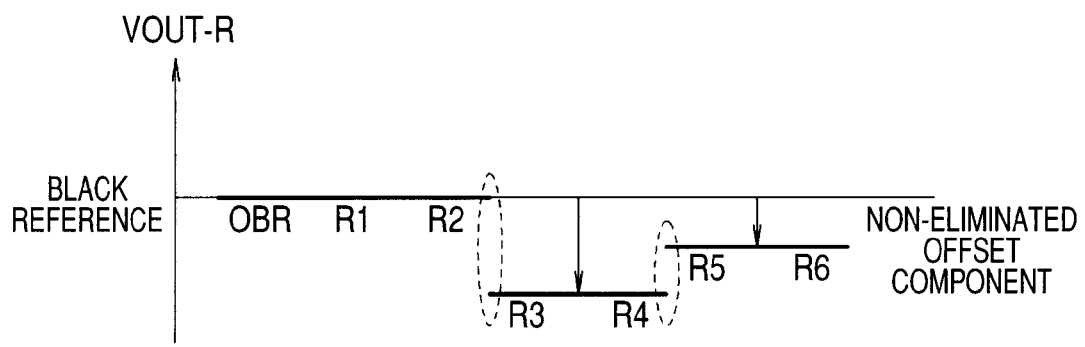
FIGS. 11A and 11B are diagrams illustrating an example of output after OB clamping in the drive shown in FIG. 9.

The signal VOUT-R is output as shown in FIG. 11A, for example. It is also assumed that the positive direction of the axis of ordinates is the same as the optical amplitude direction in FIG. 11A. In the first time of the second vertical transfer 72-1, the signals 2 from the optical black pixel OBR1, the R pixel R1 and the R pixel R2 are transferred at the same time as the signals from the G pixel G5 and the G pixel G6, which correspond to the light green regions. Accordingly, the offset due to smear appears the strongest in the 'floating' direction here in comparison with the second time of the second vertical transfer 72-2 and the third time of the second vertical transfer 72-3. In the second time of the second vertical transfer 72-2, since the signals from the R pixel R3 and the R pixel R4 are transferred at the same time as the signals from the G pixel G1 and the G pixel G2, which correspond to the black regions, the offset due to smear does not occur and the smear is at the lowest level.

Figure 11B:
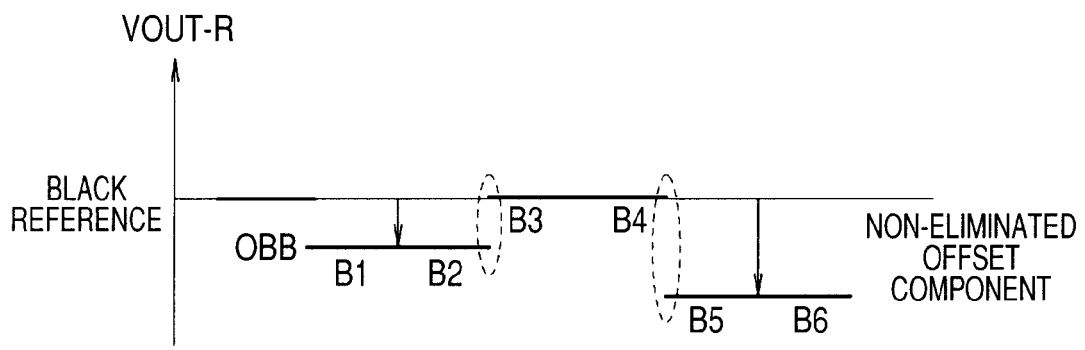

If the above-mentioned OB clamp is performed during this output, in the signals VOUT-R, the signals from the R pixel R1 and the R pixel R2 agree with the black reference value, and the signals from the R pixels R3 to R6 remain as offset components as shown in FIG. 11A. In this example, since there are no color components other than green, the signals VOUT-R should output certain black, but unremoved offset components cause differences between the R pixel R2 and the R pixel R3, and the R pixel R4 and the R pixel R5. Similarly, in the output in the case where the signals VOUT-B is taken into consideration, there are differences between the B pixel B2 and the B pixel B3, and the B pixel B4 and the B pixel B5 as shown in FIG. 11B. Due to the above-mentioned mechanism, differences occur in the places where such differences should not have occurred and, as a result, the quality of the obtained image is degraded.

Then, the solid-state imaging apparatus according to the embodiment prevents the occurrences of the difference that should have not occurred so as to reduce the degrading of the image quality due to the above-mentioned artifacts such as smear.

Figure 12:
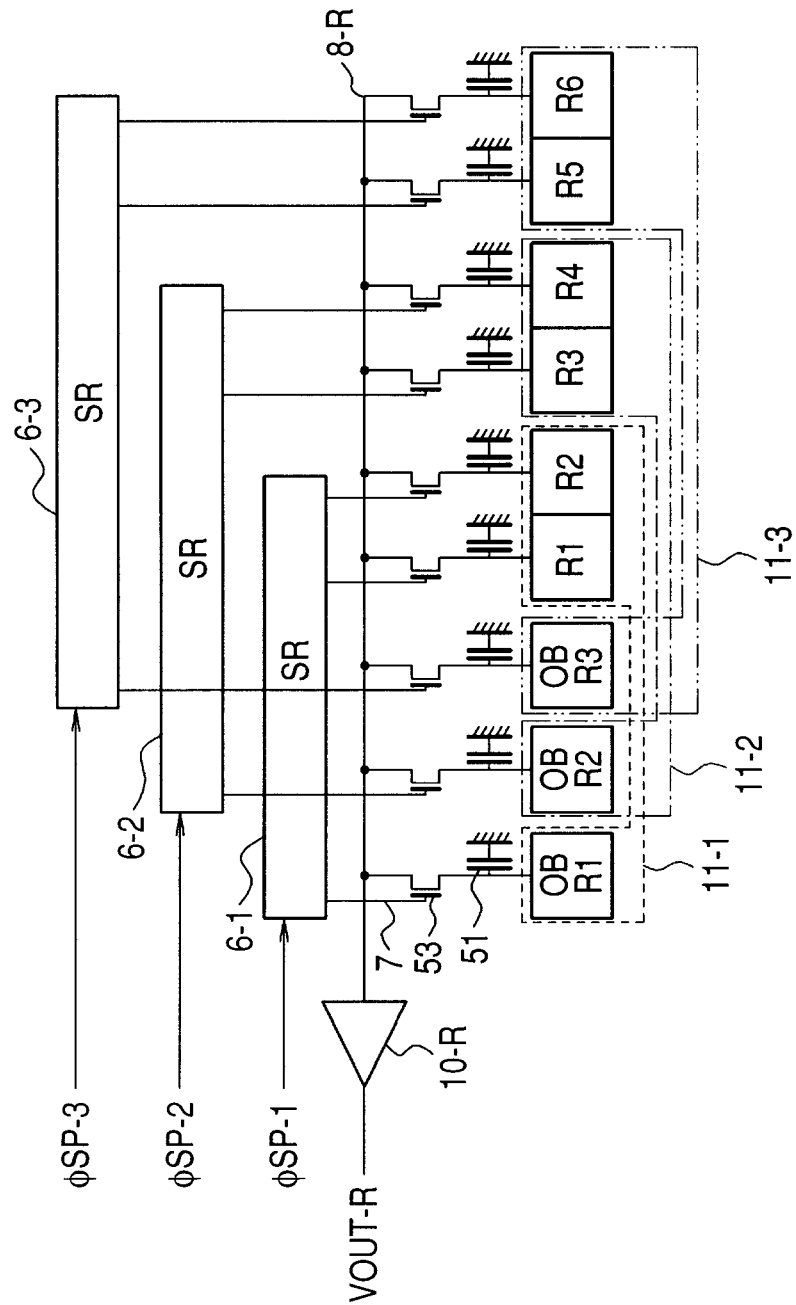
FIG. 12 is a schematic diagram illustrating an example of configuration of the solid-state imaging apparatus according to the embodiment.

FIG. 12 is a schematic diagram illustrating an example of configuration of the solid-state imaging apparatus according to the embodiment. For simplicity, only the R pixels are shown in FIG. 12. In FIG. 12, the components having the same functions as those shown in FIGS. 1, 5 and 10 are denoted by the same reference alphanumerics and redundant description thereof are omitted. The configuration shown in FIG. 12 differs from that shown in FIG. 10 in that the optical black pixels are three pixels (OBR1, OBR2 and OBR3) and the effective pixel region and the optical black pixel region are divided into three regions, respectively. The unit cell group 11-1 has the optical black pixel OBR1 and the R pixels (effective pixel) R1 and R2; and the unit cell group 11-2 has the optical black pixel OBR2 and the R pixels (effective pixels) R3 and R4. The unit cell group 11-3 has the optical black pixel OBR3 and the R pixels (effective pixels) R5 and R6. The scan signals 7 from the scanning circuits 6-1, 6-2 and 6-3 are applied to the transferring switches 53 in the corresponding columns according to the combination of the unit cell groups 11. Although not shown here, similarly for the G pixels and B pixels, the sets of the optical black pixels and the effective pixels are combined as the unit cell groups 11-1 to 3.

Figure 13:
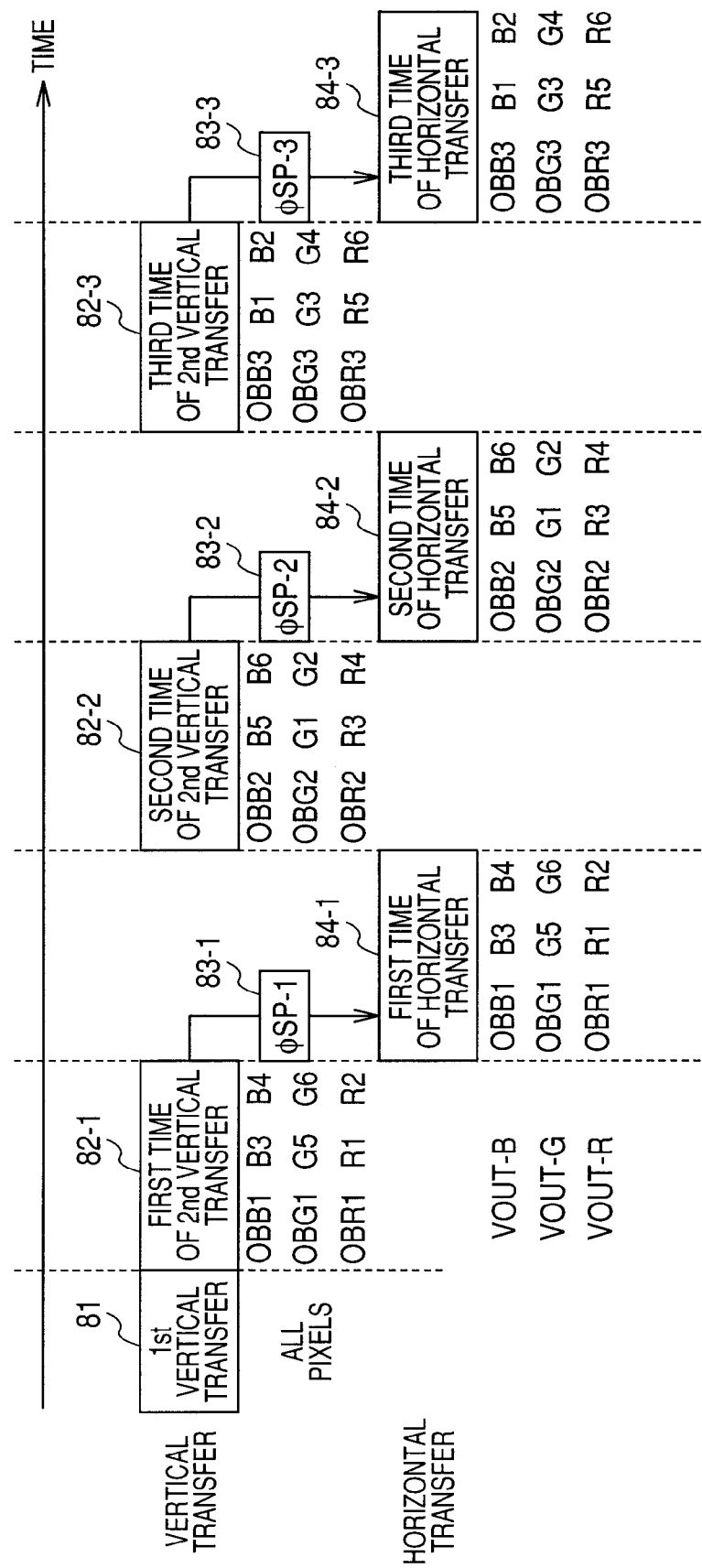
FIG. 13 is a timing flow chart illustrating an example of operation of the solid-state imaging apparatus shown in FIG. 12.

FIG. 13 is a timing flow chart of the solid-state imaging apparatus according to the embodiment, configuration of which is partially shown in FIG. 12. FIG. shows a first vertical transfer operation 81, second vertical transfer operations 82-1, 82-2 and 82-3, and horizontal transfer operations 84-1, 84-2 and 84-3. The figure also shows start pulses φSP 83-1, 83-2 and 83-3 for starting the scan by the scanning circuits 6-1, 6-2 and 6-3, respectively. The alphanumerics (OBR1, R1, R2 and the like) under the boxes showing the transfer operations indicate the pixels, to which the signals are transferred by the transfer operations.

As shown in FIG. 13, in the embodiment, the signals from the three optical black pixels OBR1, OBR2 and OBR3 are transferred by the second vertical transfers 82-1, 82-2 and 82-3 and the horizontal transfers 84-1, 84-2 and 84-3, respectively. That is, the signals from the optical black pixel OBR1, R pixel R1 and R pixel R2 are transferred by the first time of the second vertical transfer 82-1 and the horizontal transfer 84-1 and output as the signals VOUT-R. The signals from the optical black pixel OBR2, R pixel R3 and R pixel R4 are transferred by the second time of the second vertical transfer 82-2 and the horizontal transfer 84-2 and output as the signals VOUT-R. Similarly, the signals from the optical black pixel OBR3, R pixel R5 and R pixel R6 are transferred by the third time of the second vertical transfer 82-3 and the horizontal transfer 84-3 and output as the signals VOUT-R.

Figure 14:
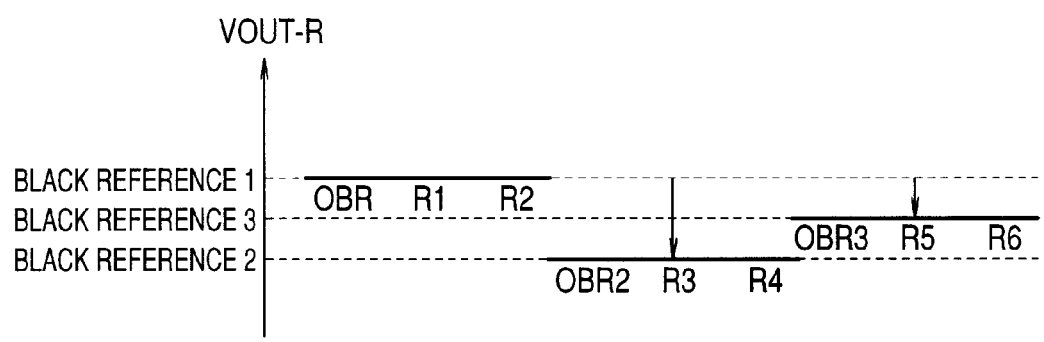
FIG. 14 is a diagram illustrating an example of output after OB clamping in the drive shown in FIG. 12.

Here, the OB clamp after the solid-state imaging apparatus is performed each time when signals are output in the three times of the horizontal transfers 84-1, 84-2 and 84-3, and at each time of the output, the black reference value is decided based on the output from the optical black pixel. With the operations, if different offsets occur at respective output, these offsets are properly removed by the black reference values as shown in FIG. 14. As a result, no difference due to smear and the like occurs in the finally obtained image so that the degrading of the image quality can be reduced. FIG. 14 is also based on the assumption that the arrangement of the effective pixels in the six bits is such that black images are input in the first and second bits, dark green images are input in the third and fourth bits, and light green images are input in the fifth and sixth bits.

Although FIG. 12 shows the shielded optical black pixels are arranged to the left of the non-shielded effective pixel column as an example, the optical black pixels can be arranged to the right of the effective pixel column. Even in the latter case, the order of the pixels, from which the signals are scanned by the scanning circuit 6, (scanning order) is preferably the same as the above-mentioned order. It is assumed that the analog OB clamp is performed in the above-mentioned description; if the OB clamp is performed by using the digital values after the A/D (analog-digital) conversion, the signals from the optical black pixel are not necessarily at the beginning of each horizontal transfer. Although the figure shows the solid-state imaging apparatus having three optical black pixels and six effective pixels, each arranged in the row direction, as an example, the number of the pixels are not limited. It is preferable that both of the number of the optical black pixels (sum of the unit cells containing the optical black pixels) and the number of the effective pixels (sum of the unit cells containing the effective pixels) are multiples of the number of the unit cell groups (multiples of three in this example), for example. It is also preferable that the sum of the number of the unit cells containing the optical black pixels and the number of the unit cells containing the effective pixels in the unit cell groups 11 is the same as the number of the unit cell groups 11, for example. It is also preferable that enough number of the optical black pixels upon each of the horizontal transfer is prepared for performing the OB clamp afterwards.

Although it is described that the degrading of the image quality due to the artifact like smear caused by the amplifying circuit arranged for each column can be reduced in the embodiment, the present invention is not limited to this. For example, if the artifact caused by another readout circuit and the readout circuit performs the divided readout operation for a number of times, the same advantages as those of the present invention can be obtained by reading out the signals from the optical black pixels and the effective pixels in parallel in each of the repeated operations after the division. As other readout circuits, the source follower circuit in the pixel, which causes a smear as described in the problems to be solved by the invention, the holding capacitor and the like can be considered.

According to the embodiment, when the vertical transfer and the horizontal transfer are performed by a plurality of times to read out and output the signals from the pixels, signals from the shielded optical black pixel and signals from the non-shielded effective pixel are output for each time. Accordingly, if different offsets occur at respective time of output, the offsets can be properly removed so that the degrading of the image quality due to the artifact like the smear can be reduced.

The above-mentioned embodiments are merely an example of implementing the present invention, and the technical scope of the present invention should not be limited by the embodiments. That is, the present invention can be implemented in various forms without departing from its technical ideas or main features.

Although the amplifying circuit 42 is taken as an example of a unit that causes the horizontal smear in the specification, but it is not limited to that. The horizontal smear may occur in any unit that has circuitry for processing or sample-holding the signals from a plurality of pixels in parallel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-233707, filed Oct. 7, 2009, which is hereby incorporated by reference herein in its entirety.

What is claimed is:
1. A solid-state imaging apparatus comprising:
a plurality of unit cell groups each including a plurality of unit cells, with each unit cell including a plurality of pixels including one or more optical black pixels and one or more effective pixels having spectral sensitivities dif- ferent from each other, and a plurality of first holding capacitors each corresponding to each of the pixels;

a plurality of second holding capacitors each corresponding to each of the unit cells, for receiving signals from each of the unit cells;

a plurality of scanning circuits, each individual scanning circuit corresponding to a different one of the plurality of unit cell groups and said each individual scanning circuit configured to scan the corresponding unit cell group; and a plurality of common signal lines, the solid-state imaging apparatus being configured to perform:

a first transfer operation for transferring together all of the signals accumulated during a same period in the pixels to the first holding capacitors to hold therein, a second transfer operation subsequent to the first transfer operation for transferring the signals held in the first holding capacitors successively to the second holding capacitors to hold therein, and a third transfer operation for reading successively the signals in the second holding capacitors to the common signal lines, such that the second transfer operation and the third transfer operation are repeated at least a same number of times as a number of the plurality of unit cell groups, and a signal from one of the optical black pixels is transferred at each time of the second transfer operation, and the signal from the one of the optical black pixels is transferred at each time of the third transfer operation, wherein an optical black pixel and an effective pixel included in a same one of the unit cells are successively scanned by a same one of the scanning circuits during the third transfer operation, while the optical black pixels or the effective pixels included in different ones of the unit cells are successively scanned by different ones of the scanning circuits during the third transfer operation, and the plurality of scanning circuits output simultaneously the signals from the different ones of the plurality of unit cell groups to corresponding ones of the common signal lines.

2. The solid-state imaging apparatus according to claim 1, wherein each pixel includes a source follower circuit.

3. The solid-state imaging apparatus according to claim 2, wherein the first transfer operation includes a transfer of each signal by the source follower circuit.

4. The solid-state imaging apparatus according to claim 1, wherein the first transfer operation includes a transfer of each signal by an amplifying circuit.

5. The solid-state imaging apparatus according to claim 1, wherein the first transfer operation includes a transfer of the signal to the respective first holding capacitor.

6. The solid-state imaging apparatus according to claim 1, wherein the third transfer operation is performed such that a signal transferred from the optical black pixel is read out before reading out a signal transferred from the effective pixel.

7. The solid-state imaging apparatus according to claim 1, wherein the unit cell groups include the optical black pixels, such that a sum of a total number of unit cells formed from the optical black pixels and a total number of unit cells formed from the effective pixels equals a number of the unit cell groups.

8. The solid-state imaging apparatus according to claim 1, wherein each unit cell further comprises:

a plurality of intermediate holding units corresponding respectively to pixels having spectral sensitivities different from each other, and a selecting unit arranged between each of the intermediate holding units and the first holding capacitor; and wherein the solid-state imaging apparatus further comprises:

a plurality of common output lines, and switch units respectively arranged between the second holding capacitors and each of the common output lines.

9. A method of driving a solid-state imaging apparatus comprising: a plurality of unit cell groups each including a plurality of unit cells, with each unit cell including a plurality of pixels including one or more optical black pixels and one or more effective pixels having spectral sensitivities different from each other, and a plurality of first holding capacitors each corresponding to the each of the pixels;

a plurality of second holding capacitors each corresponding to each of the unit cells, for receiving signals from the each of the unit cells;

a plurality of scanning circuits, each individual scanning circuit corresponding to a different one of the plurality of unit cell groups and said each individual scanning circuit configured to scan the corresponding unit cell group; and a plurality of common signal lines, the method comprising the steps of:

a first transfer step for transferring together all of the signals accumulated during a same period in the pixels to the first holding capacitors to hold therein, a second transfer step subsequent to the first transfer step for transferring the signals held in the first holding capacitors successively to the second holding capacitors to hold therein, and a third transfer step for reading successively the signals in the second holding capacitor to the common signal lines, such that the second transfer step and the third transfer step are repeated at least a same number of times as a number of the plurality of unit cell groups, and a signal from one of the optical black pixels is transferred at each time of the second transfer step, and the signal from the optical black pixel is transferred at each time of the third transfer step, wherein the optical black pixel and the effective pixel included in a same one of the unit cells are successively scanned by a same one of the scanning circuits during the third transfer operation, while the optical black pixels or the effective pixels included in different ones of the unit cells are successively scanned by different ones of the scanning circuits during the third transfer operation, and the plurality of scanning circuits output simultaneously the signals from the different ones of the plurality of unit cell groups to corresponding ones of the common signal lines.

* * * * *